(12) United States Patent
Mirichigni et al.

(10) Patent No.: US 10,067,890 B2
(45) Date of Patent: *Sep. 4, 2018

(54) APPARATUSES AND METHODS FOR VARIABLE LATENCY MEMORY OPERATIONS

(71) Applicant: Micron Technology, Inc., Boise, ID (US)

(72) Inventors: Graziano Mirichigni, Vimercate (IT); Daniele Balluchi, Cernusco Sul Naviglio (IT); Luca Porzio, Casalnuovo di Napoli (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/667,358

(22) Filed: Aug. 2, 2017

(65) Prior Publication Data

US 2017/0329534 A1 Nov. 16, 2017

Related U.S. Application Data

(63) Continuation of application No. 13/838,296, filed on Mar. 15, 2013, now Pat. No. 9,734,097.

(51) Int. Cl.
*G06F 13/16* (2006.01)
*G11C 7/10* (2006.01)

(52) U.S. Cl.
CPC ........ *G06F 13/1689* (2013.01); *G11C 7/1063* (2013.01)

(58) Field of Classification Search
CPC ..... G06F 13/1689; G11C 7/22; G11C 7/1063; G11C 8/18; G11C 13/0028; G11C 13/0061
See application file for complete search history.

(56) References Cited

U.S. PATENT DOCUMENTS 4,833,642 A 5/1989 Ooi
5,287,469 A 2/1994 Tsuboi
(Continued)

FOREIGN PATENT DOCUMENTS

CN 1497604 A 5/2004
CN 1860460 A 11/2006
(Continued)

OTHER PUBLICATIONS

International Search Report and Written Opinion for PCT/US2014/021118 dated Jun. 27, 2014.
(Continued)

*Primary Examiner* — Nathan Sadler
(74) *Attorney, Agent, or Firm* — Dorsey & Whitney LLP

(57) ABSTRACT

Apparatuses and methods for variable latency memory operations are disclosed herein. An example apparatus may include a memory configured to provide first information during a variable latency period indicating the memory is not available to perform a command, wherein the first information is indicative of a remaining length of the variable latency period, the remaining length is one of a relatively short, normal, or long period of time, the memory configured to provide second information in response to receiving the command after the latency period.

20 Claims, 8 Drawing Sheets

800

| BIT3 | BIT2 | BIT1 | ACKNOWLEDGE EVENT | CURRENT READ COMMAND | CURRENT WRITE COMMAND |
|---|---|---|---|---|---|
| 0 | 0 | 1 | | ACCEPTED | |
| 0 | 1 | 1 | WAIT DE-ASSERTED | ACCEPTED BUT A HOUSE KEEPING OPERATION IS SUGGESTED ACTION: ISSUE HOUSE KEEPING COMMAND | |
| 1 | 0 | 1 | | ACCEPTED BUT THERE HAS BEEN AN ERROR DURING A PREVIOUS OPERATION (E.G. LOCK ERROR) ACTION: CHECK STATUS REGISTER | |
| 1 | 1 | 1 | | NA | REJECTED DUE TO AN ERROR (E.G. LOCK ERROR) ACTION: CHECK STATUS REGISTER |

(56) References Cited

U.S. PATENT DOCUMENTS

| | | | |
|---|---|---|---|
| 5,369,616 A * | 11/1994 | Wells | G06F 3/0601 |
| | | | 365/185.22 |
| 5,546,344 A | 8/1996 | Fawcett | |
| 5,668,972 A | 9/1997 | Liu et al. | |
| 5,778,432 A | 7/1998 | Rubin et al. | |
| 5,822,244 A | 10/1998 | Hansen et al. | |
| 5,892,961 A | 4/1999 | Trimberger | |
| 5,893,149 A | 4/1999 | Hagersten et al. | |
| 5,953,522 A | 9/1999 | Fox et al. | |
| 6,026,034 A | 2/2000 | Suzuki et al. | |
| 6,201,739 B1 | 3/2001 | Brown et al. | |
| 6,412,045 B1 | 6/2002 | DeKoning et al. | |
| 6,546,462 B1 | 4/2003 | Palanca et al. | |
| 6,552,956 B2 | 4/2003 | Shibata | |
| 6,629,224 B1 | 9/2003 | Suzuki et al. | |
| 6,879,540 B2 | 4/2005 | Maruyama et al. | |
| 6,996,016 B2 | 2/2006 | Oh | |
| 7,139,673 B1 * | 11/2006 | Vashi | G06F 11/273 |
| | | | 702/122 |
| 7,173,863 B2 | 2/2007 | Conley et al. | |
| 7,219,251 B2 | 5/2007 | Adkisson | |
| 7,363,540 B2 | 4/2008 | Patel et al. | |
| 7,579,683 B1 | 8/2009 | Falik et al. | |
| 7,590,013 B2 | 9/2009 | Yu et al. | |
| 7,624,209 B1 | 11/2009 | Ansari et al. | |
| 7,643,334 B1 | 1/2010 | Lee et al. | |
| 7,802,039 B2 | 9/2010 | Morita | |
| 7,865,658 B2 | 1/2011 | Lasser et al. | |
| 8,004,884 B2 | 8/2011 | Franceschini et al. | |
| 8,030,981 B2 | 10/2011 | Kim | |
| 8,195,891 B2 | 6/2012 | Trika | |
| 8,539,129 B2 | 9/2013 | Wang | |
| 8,582,356 B2 | 11/2013 | Abdulla | |
| 8,595,441 B1 | 11/2013 | Nakibly et al. | |
| 8,902,684 B2 | 12/2014 | Kwean | |
| 9,042,156 B2 | 5/2015 | Nakura et al. | |
| 9,563,565 B2 | 2/2017 | Bernardi et al. | |
| 9,710,192 B2 | 7/2017 | Mirichigni et al. | |
| 9,727,493 B2 | 8/2017 | Mirichigni et al. | |
| 9,734,097 B2 | 8/2017 | Mirichigni et al. | |
| 9,740,485 B2 | 8/2017 | Mirichigni et al. | |
| 9,754,648 B2 | 9/2017 | Mirichigni et al. | |
| 2002/0006074 A1 * | 1/2002 | Roohparvar | G06F 13/1615 |
| | | | 365/233.1 |
| 2002/0168816 A1 | 11/2002 | Shibata | |
| 2003/0212865 A1 | 11/2003 | Hicken et al. | |
| 2004/0098549 A1 | 5/2004 | Dorst | |
| 2005/0068812 A1 | 3/2005 | Oh | |
| 2006/0028883 A1 | 2/2006 | Shimoyama | |
| 2006/0069812 A1 | 3/2006 | Osborne | |
| 2006/0268619 A1 | 11/2006 | Chen | |
| 2007/0005922 A1 | 1/2007 | Swaminathan et al. | |
| 2007/0145151 A1 | 6/2007 | Nakamura et al. | |
| 2007/0150688 A1 | 6/2007 | Osborne et al. | |
| 2007/0156991 A1 | 7/2007 | Gould et al. | |
| 2007/0217253 A1 | 9/2007 | Kim et al. | |
| 2008/0082707 A1 | 4/2008 | Gupta et al. | |
| 2008/0117682 A1 | 5/2008 | Byeon | |
| 2008/0270811 A1 | 10/2008 | Chow et al. | |
| 2008/0304351 A1 | 12/2008 | Lim et al. | |
| 2008/0307165 A1 | 12/2008 | Kazuhiro | |
| 2008/0320214 A1 | 12/2008 | Ma et al. | |
| 2009/0024778 A1 | 1/2009 | Morita | |
| 2009/0044190 A1 | 2/2009 | Tringali et al. | |
| 2009/0157974 A1 | 6/2009 | Lasser | |
| 2009/0265514 A1 | 10/2009 | Biles et al. | |
| 2010/0013675 A1 | 1/2010 | Bennett | |
| 2010/0023675 A1 | 1/2010 | Chen et al. | |
| 2010/0124090 A1 | 5/2010 | Arai | |
| 2010/0124102 A1 | 5/2010 | Lee et al. | |
| 2010/0161880 A1 | 6/2010 | You | |
| 2010/0161932 A1 | 6/2010 | Stern et al. | |
| 2010/0172179 A1 | 7/2010 | Gorobets et al. | |
| 2010/0174955 A1 | 7/2010 | Carnevale et al. | |
| 2010/0269118 A1 | 10/2010 | Arimilli et al. | |
| 2010/0293343 A1 | 11/2010 | Perego | |
| 2011/0035536 A1 | 2/2011 | Shim et al. | |
| 2011/0047319 A1 | 2/2011 | Jeon et al. | |
| 2011/0055453 A1 | 3/2011 | Bennett | |
| 2011/0072190 A1 | 3/2011 | Borracini et al. | |
| 2011/0153900 A1 | 6/2011 | Zitlaw | |
| 2011/0170354 A1 | 7/2011 | DeCaro et al. | |
| 2011/0197014 A1 | 8/2011 | Yeh | |
| 2011/0238866 A1 | 9/2011 | Zitlaw | |
| 2011/0289255 A1 | 11/2011 | Wang et al. | |
| 2011/0314324 A1 | 12/2011 | Ozdemir | |
| 2012/0017053 A1 | 1/2012 | Yang et al. | |
| 2012/0054419 A1 | 3/2012 | Chen et al. | |
| 2012/0066434 A1 | 3/2012 | Zitlaw | |
| 2012/0117303 A1 | 5/2012 | Carannante et al. | |
| 2012/0124317 A1 | 5/2012 | Mirichigni et al. | |
| 2012/0131263 A1 | 5/2012 | Yeh | |
| 2012/0131304 A1 | 5/2012 | Franceschini et al. | |
| 2012/0173809 A1 | 7/2012 | Ko et al. | |
| 2012/0179860 A1 | 7/2012 | Falanga et al. | |
| 2012/0216085 A1 | 8/2012 | Weingarten et al. | |
| 2012/0265922 A1 | 10/2012 | Post et al. | |
| 2012/0324141 A1 | 12/2012 | Seong et al. | |
| 2012/0331207 A1 | 12/2012 | Lassa et al. | |
| 2013/0036253 A1 | 2/2013 | Baltar | |
| 2013/0058175 A1 | 3/2013 | Lin et al. | |
| 2013/0159766 A1 | 6/2013 | D'Abreu et al. | |
| 2013/0191601 A1 | 7/2013 | Peterson et al. | |
| 2013/0191704 A1 | 7/2013 | Eleftheriou et al. | |
| 2013/0262746 A1 | 10/2013 | Srinivasan | |
| 2014/0013028 A1 | 1/2014 | Rametta | |
| 2014/0082259 A1 | 3/2014 | Yeh | |
| 2014/0122814 A1 | 5/2014 | Minchigni et al. | |
| 2014/0122822 A1 | 5/2014 | Minchigni et al. | |
| 2014/0136771 A1 | 5/2014 | Cornwell et al. | |
| 2014/0281182 A1 | 9/2014 | Minchigni et al. | |
| 2015/0052288 A1 | 2/2015 | Mirichigni et al. | |
| 2015/0052299 A1 | 2/2015 | Mirichigni et al. | |
| 2015/0095551 A1 | 4/2015 | Confalonieri et al. | |
| 2015/0100744 A1 * | 4/2015 | Mirichigni | G06F 12/023 |
| | | | 711/154 |
| 2015/0347038 A1 | 12/2015 | Monteleone et al. | |
| 2017/0083263 A1 | 3/2017 | Mirichigni et al. | |
| 2017/0147234 A1 | 5/2017 | Frans et al. | |
| 2017/0300413 A1 | 10/2017 | Mirichigni et al. | |
| 2017/0308382 A1 | 10/2017 | Mirichigni et al. | |
| 2017/0309318 A1 | 10/2017 | Mirichigni et al. | |

FOREIGN PATENT DOCUMENTS

| | | |
|---|---|---|
| CN | 101256539 A | 9/2008 |
| CN | 101820450 A | 9/2010 |
| JP | 2005108395 A | 4/2005 |

OTHER PUBLICATIONS

Office Action dated Nov. 22, 2016 for JP Application No. 2016-500725.
U.S. Appl. No. 15/637,961, entitled "Apparatuses and Methods for Providing Data to a Configurable Storage Area", filed Jun. 29, 2017.
U.S. Appl. No. 15/643,361, entitled "Apparatuses and Methods for Memory Operations Having Variable Latencies", filed Jul. 6, 2017.
"Available"—Definition from Wiktionary, the free dictionary—Archived revision by Tuvalkin (talk | contribs) as of 21:49, Jan. 5, 2012. https://en.wiktionary.org/w/index.php?title=available &oldid=15765189 Downloaded Jan. 13, 2016, Jan. 5, 2012.
First office action received for China app. # 201480008522.4 dated Apr. 1, 2017.
First Rejection Action for Korean Patent Appln. No. 10-2015-7023816 dated Aug. 31, 2016.
"JEDEC—Low Power Double Data Rate 2 (LPDDR2)", Feb. 2010.
Received EP Search Report dated Nov. 3, 2016 for EP application No. 14770419.1.
Handy, J., "The Cache Memory Book Second Edition", Academic Press Prof., Inc., San Diego, CA, Jan. 1993, p. 67.
Qureshi, et al., "Enhancing Lifetime and Security of PCM-Based Main Memory with Start-Gap Wearing Leveling",

(56) References Cited

OTHER PUBLICATIONS

Microarchitecture, 2009 42nd Annual IEEE/ACM International Symposium, Dec. 12-16, 2009, 14-23.
Examination Report dated Jan. 3, 2018 for European Application No. 14770419.1.
Translation of Second Office Action dated Jan. 26, 2018 for Chinese Application No. 201480008522.4.
U.S. Appl. No. 15/857,435, entitled 'Apparatuses and Methods for Providing Data to a Configurable Storage Area', filed Dec. 28, 2017.

* cited by examiner

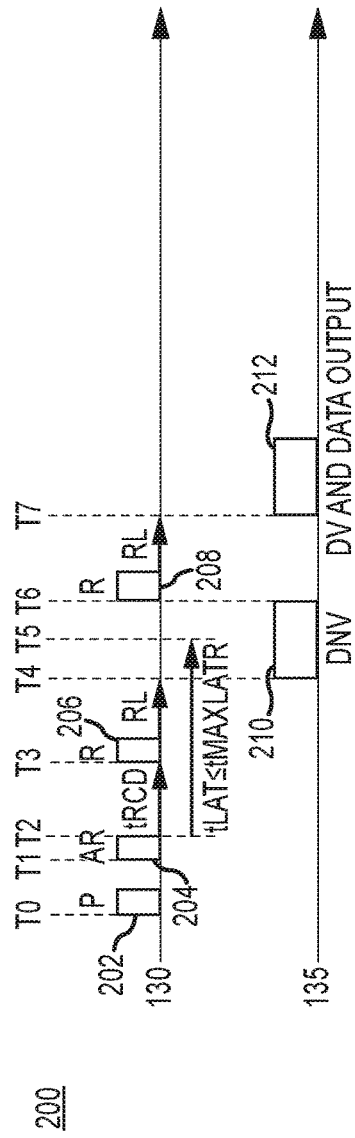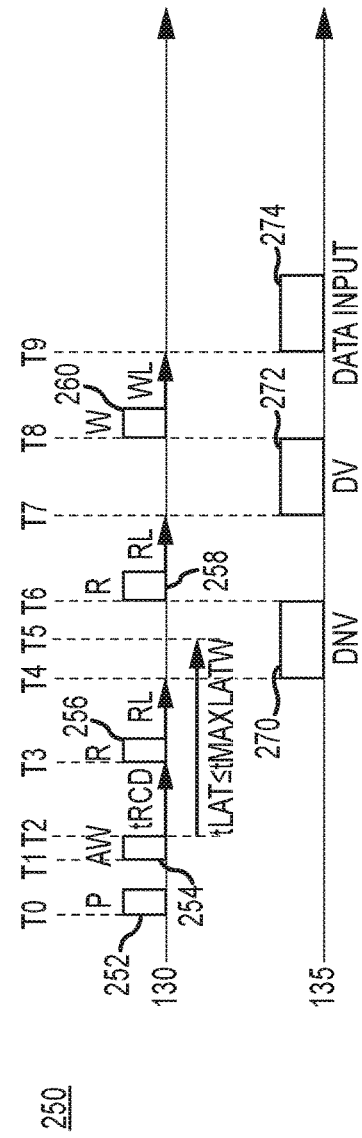

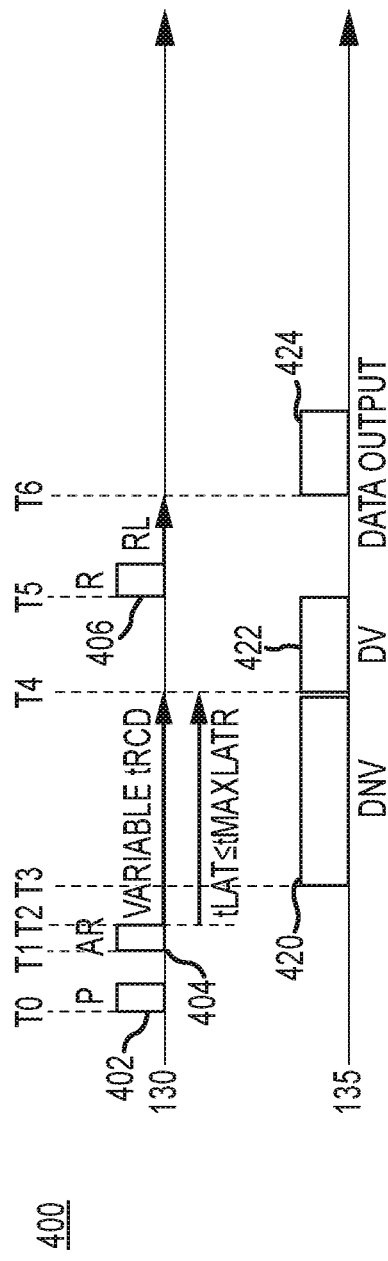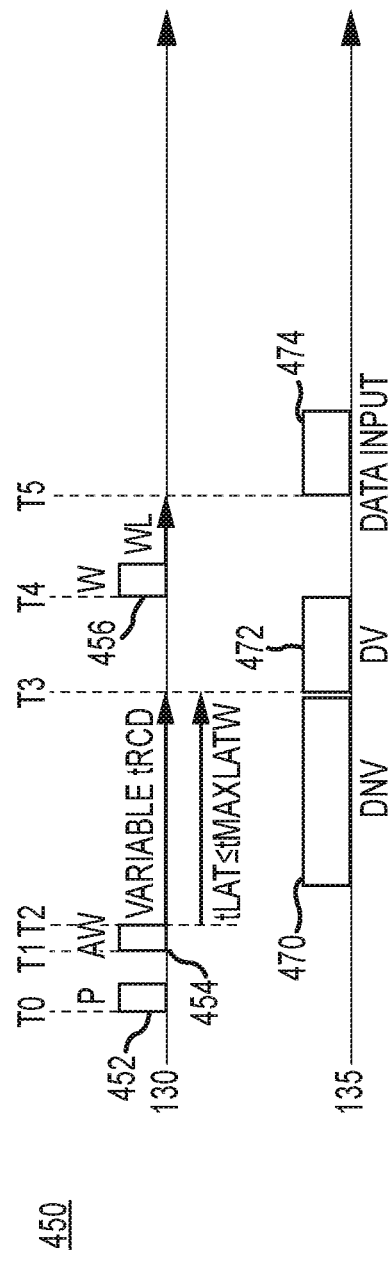

| 600 | | | | |
|---|---|---|---|---|
| TOR[5:3] | TRANSPARENT WRITE MAX LATENCY TIME (tMAXLATW) | 000 | UNLIMITED | tBUSY=LATENCY CONFIGURATION GRANULARITY (I.E. 25us) UNLIMITED ALLOWS MEMORY TO COMPLETE ANY INTERNAL OPERATION |
| | | 001 | 1*tBUSY | |
| | | 010 | 2*tBUSY | |
| | | 011 | 3*tBUSY | |
| | | 100 | 4*tBUSY | |
| | | 101 | 5*tBUSY | |
| | | 110 | 6*tBUSY | |
| | | 111 | 7*tBUSY | |
| TOR[2:0] | TRANSPARENT READ MAX LATENCY TIME (tMAXLATR) | 000 | UNLIMITED | tBUSY=LATENCY CONFIGURATION GRANULARITY (I.E. 25us) UNLIMITED ALLOWS MEMORY TO COMPLETE ANY INTERNAL OPERATION |
| | | 001 | 1*tBUSY | |
| | | 010 | 2*tBUSY | |
| | | 011 | 3*tBUSY | |
| | | 100 | 4*tBUSY | |
| | | 101 | 5*tBUSY | |
| | | 110 | 6*tBUSY | |
| | | 111 | 7*tBUSY | |

FIGURE 6

| 700 | | | |
|---|---|---|---|
| BIT 3 | BIT 2 | BIT 1 | WAIT STATE |
| 0 | 0 | 0 | "SHORT" → WAIT ASSERTED, <= 1us (E.G.) |
| 0 | 1 | 0 | "NORMAL" → WAIT ASSERTED, <= tBUSY |
| 1 | 0 | 0 | "LONG" → WAIT ASSERTED, > tBUSY |
| 1 | 1 | 0 | RESERVED |

| BIT3 | BIT2 | BIT1 | ACKNOWLEDGE EVENT | CURRENT READ COMMAND | CURRENT WRITE COMMAND |
|---|---|---|---|---|---|
| 0 | 0 | 1 | WAIT DE-ASSERTED | ACCEPTED | |
| 0 | 1 | 1 | WAIT DE-ASSERTED | ACCEPTED BUT A HOUSE KEEPING OPERATION IS SUGGESTED<br><br>ACTION: ISSUE HOUSE KEEPING COMMAND | |
| 1 | 0 | 1 | WAIT DE-ASSERTED | ACCEPTED BUT THERE HAS BEEN AN ERROR DURING A PREVIOUS OPERATION (E.G. LOCK ERROR)<br><br>ACTION: CHECK STATUS REGISTER | |
| 1 | 1 | 1 | WAIT DE-ASSERTED | NA | REJECTED DUE TO AN ERROR (E.G. LOCK ERROR) ACTION: CHECK STATUS REGISTER |

FIGURE 8

APPARATUSES AND METHODS FOR VARIABLE LATENCY MEMORY OPERATIONS

CROSS-REFERENCED TO RELATED APPLICATION

This application is a continuation of U.S. patent application Ser. No. 13/838,296, filed Mar. 15, 2013, and issued as U.S. Pat. No. 9,734,097 on Aug. 15, 2017. This application and patent are incorporated by reference herein, in their entirety and for all purposes.

TECHNICAL FIELD

Embodiments of the present invention relate generally to memories, and more specifically, in one or more described embodiments, to variable latency memory operations.

BACKGROUND

Memories may be provided in a variety of apparatuses, such as computers or other devices, including but not limited to portable memory devices, solid state drives, personal digital assistants, music players, cameras, phones, wireless devices, displays, chip sets, set top boxes, gaming systems, vehicles, and appliances. There are many different types of memory including random-access memory (RAM), read only memory (ROM), dynamic random access memory (DRAM), synchronous dynamic random access memory (SDRAM), flash memory, and resistance variable memory, among others.

Apparatuses, such as resistance variable memory devices, may be used as non-volatile memory for a wide range of electronic devices. Resistance variable memory devices may include, for example, phase change memory (PCM) or resistive memory (RR), among others.

A conventional read operation using PCM is also similar to read operations for RAM. Accordingly, PCM may be used to implement random access memory. Write operations with PCM, however, may be relatively slower than write operations for conventional RAM. For example, PCMs may require additional time to manage and complete write operations, such as preparing data to be written to memory, suspending a write operation in case of a read access request, and monitoring progress of a write operation. Read operations may be slower than for conventional RAM and read operations cannot be performed at a memory location undergoing write operation.

As a result of the limitations of using PCM as RAM replacement, operation of PCMs in memory systems may be restricted. For example, write and read operations may not be performed at any time on any memory location. Status registers used for monitoring the progress of write operations may be regularly queried to determine whether a particular write operation has completed before another write operation is performed. Additionally, in some applications write operations are necessarily suspended for read operations and resumed upon completion of the read operation.

BRIEF DESCRIPTION OF THE DRAWINGS

FIG. 2A is a timing diagram illustrating various signals of a read operation according to an embodiment of the present invention.
FIG. 2B is a timing diagram illustrating various signals of a write operation according to an embodiment of the present invention.
FIG. 4A is a timing diagram illustrating various signals of a read operation according to an embodiment of the present invention.
FIG. 4B is a timing diagram illustrating various signals of a write operation according to an embodiment of the present invention.
FIG. 6 is a table illustrating example latencies according to an embodiment of the present invention.
FIG. 7 is a table illustrating example bit assignments for wait states during memory operations according to an embodiment of the present invention.
FIG. 8 is a table illustrating example bit assignments for acknowledgement events of memory commands according to an embodiment of the present invention.

DETAILED DESCRIPTION

Apparatuses and methods for variable latency memory operations are disclosed herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
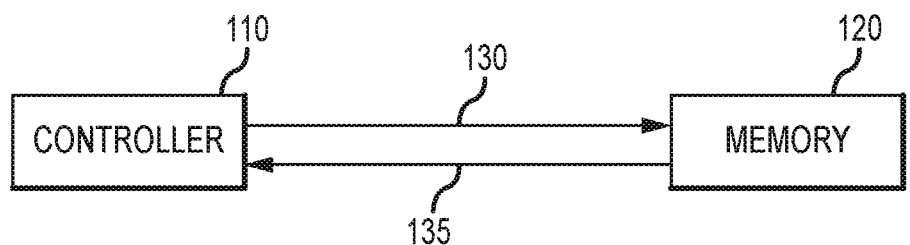
FIG. 1A is a block diagram of an apparatus according to an embodiment of the present invention.

FIG. 1A is a block diagram of an apparatus 100 according to an embodiment of the present invention. The apparatus may comprise circuitry, one or more semiconductor dice, a packaged semiconductor, a device including such circuitry, die, or package, and/or a system including such a device. The apparatus 100 includes a controller 110 (e.g., memory controller) and a memory 120. The controller 110 and the memory 120 may be coupled by a command and address (CA) bus 130 and a data bus 135. The memory 120 may be configured to receive commands and/or addresses from the controller 110 over the CA bus 130, and the memory may be configured to receive data and/or provide data over the data bus 135.

The memory 120 may be configured to perform memory operations (e.g., read operations or write operations) in response to the received commands and/or addresses that are provided by the controller 110. For example, the memory 120 may provide read data to the controller 110 over the data bus 135 in response to a read command, and may store write data received over the data bus 135 in response to a write command. Additionally, the memory 120 may further provide information to the controller 110 over the data bus 135 in response to particular commands. The information may indicate, for instance, whether the memory 120 is available to perform a memory operation and/or an amount of time before the memory 120 may become available to perform a memory operation.

In at least one embodiment, the apparatus 100 may be configured to operate in accordance with three-phase addressing. Generally, three-phase addressing may include three phases during which the memory 120 receives commands and addresses provided by the memory controller 110, responsive to which memory operations (e.g., read operations or write operations) are performed. For example, three-phase addressing may include a first phase in which the memory 120 may receive a preactive command from the controller 110 over the CA bus 120. The controller 110 may further provide a first portion of a row address to the memory 120. In response, the memory 120 may store the first portion of a row address received with the preactive command on the CA bus 120. In a second phase, the memory 120 may receive an active command from the controller 110. The controller 110 may further provide a second portion of a row address to the memory 120. In response, the memory 120 may store the second portion of the row address provided with the active command on the CA bus 120. The first portion and second portion of the row address may comprise a full row address, and the memory 120 may access data associated with the row address and store the data in a buffer. During a third phase, the memory 120 may receive a command that is provided by the controller 110. For example, the memory 120 may receive a read command or a write command that is provided by the controller 110. In response to a read command, the buffered data may be provided to the controller 110 over the data bus 135. In response to a write command, write data may be received on the data bus 135, and the memory 120 may store the write data at the row address.

In at least one embodiment, the second phase of a three-phase addressing operation may include a variable latency period tLAT. During the tLAT period, the memory 120 may manage memory operations, for instance, by preparing circuits to perform the command received in the third phase, completing a current memory operation, and/or suspending a current memory operation. Accordingly, because the memory 120 may manage any number of these and/or other memory operations during the tLAT period, the variable latency period tLAT may vary. For example, the tLAT period may vary between relatively short and relatively long durations.

In some embodiments, the memory 120 may be configured such that the tLAT period is guaranteed to elapse within one or more particular amounts of time. For example, in at least one embodiment, when the command of the third phase comprises a read command, the memory 120 may be configured to complete the second phase at least within a time tMAXLATR. That is, the tLAT period will elapse within tMAXLATR. When the command provided in the third phase comprises a write command, the memory 120 may be configured to complete the second phase at least within a time tMAXLATW. That is, the tLAT period will elapse within tMAXLATW. Values for both tMAXLATR and tMAXLATW may be stored as parameters in a register (not shown in FIG. 1). The values for tMAXLATR and tMAXLATW, in some instances, may be predetermined and/or equal or unequal. The values for tMAXLATR and tMAXLATW may be adjusted in real-time, for instance, based on priority of commands. By way of example, tMAXLATW may be increased when read commands are prioritized over write commands.

Accordingly, because a maximum duration of the tLAT period may depend on the type of command provided in a subsequent phase, in some embodiments, activate commands may indicate the type of command provided in the third phase. For example, in at least one embodiment, an activate command may comprise an activate read command or an activate write command. In this manner, the variable latency period tLAT may be based, at least in part, on whether an activate command comprises an activate read command or an activate write command. In some instances, activate read commands and activate write commands may be distinguished based on a bit value, for example, as represented by a signal. By way of example, one or more bits of a buffer address BA may be used to distinguish activate read and activate mite commands. In another example, particular combination of bits received on the CA bus 130 may indicate that an activate command comprises an activate read command or comprises an activate write command.

In some instances, the controller 110 may be configured to provide a read or write command a particular amount of time after providing an activate command, and as previously described, the tLAT period may vary based, at least in part, on the number and type of operations the memory 120 may perform during the second phase of a three-phase addressing procedure. As a result, a read or write command may be provided by the controller 110 before the tLAT period elapses, that is, prior to a time at which the memory 120 is available to perform the respective command. As will be explained in further detail below, when a command is provided prior to the tLAT period elapsing, the memory 120 may provide information indicating that the memory 120 is not available to perform a command. In some embodiments, data not valid (DNV) information is provided on the data bus 135 to indicate that the memory 120 is not available to perform a command. If a command is provided after the tLAT period elapses, the memory 120 may provide information indicating that the memory 120 is available to perform a command. In some embodiments, data valid (DV) information indicating that the memory 120 is available to perform a command and/or read data is provided on the data bus 135. In at least one embodiment, the data bus 135 may include one or more data mask signal lines that may be used for providing respective DNV and DV information.

Figure 1B:
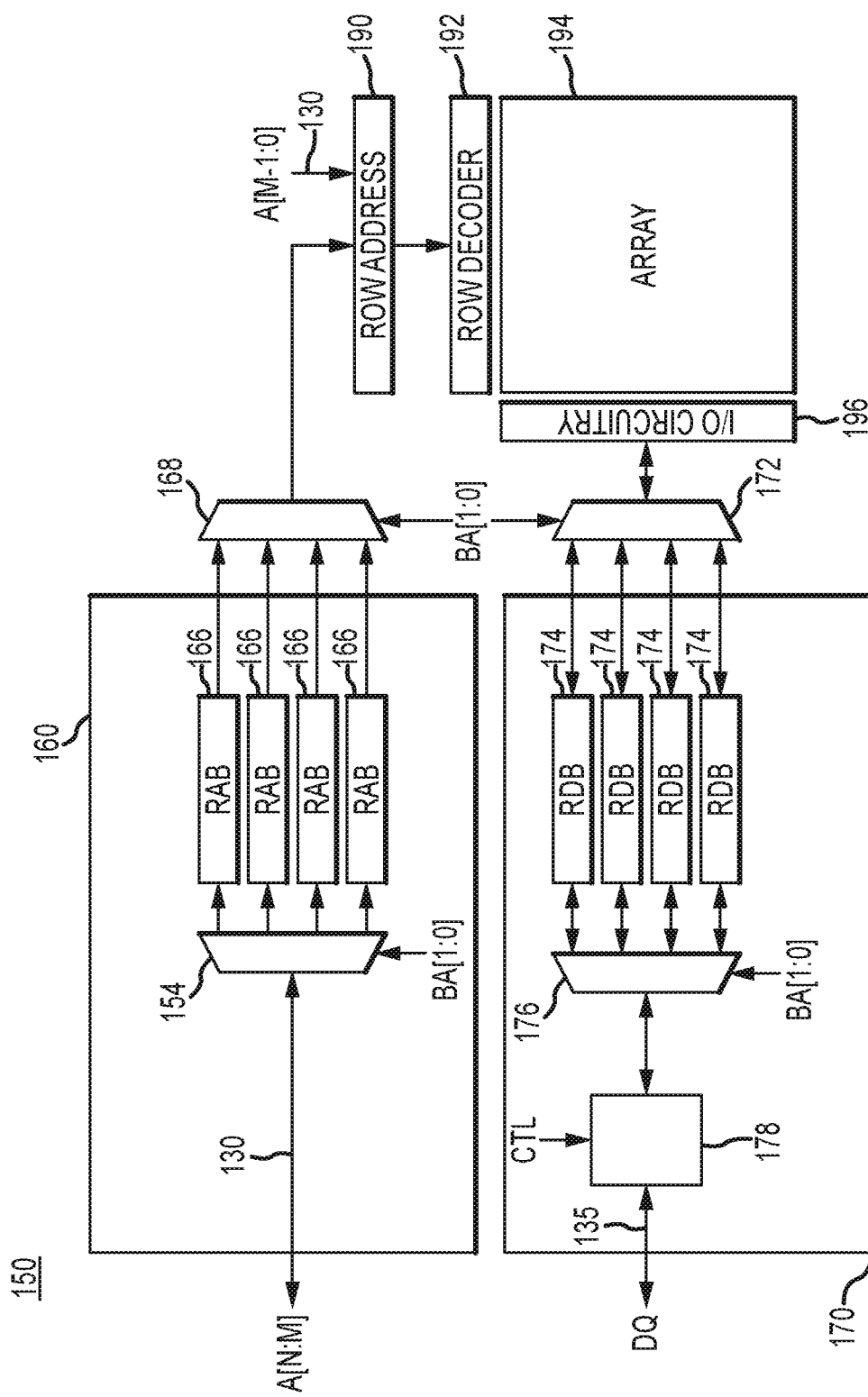
FIG. 1B is a schematic block diagram of a memory according to an embodiment of the present invention.

FIG. 1B is a schematic block diagram of a memory 150 according to an embodiment of the present invention. The memory 150 may be used to implement, at least in part, the memory 120 of FIG. 1A. The memory 150 may include an address buffer 160 and a data buffer 170. The memory 150 includes elements that have been previously described with respect to the apparatus 100 of FIG. 1A. Those elements have been identified in FIG. 1B using the same reference numbers used in FIG. 1A and operation of the common elements is as previously described. Consequently, a detailed description of the operation of these elements will not be repeated in the interest of brevity.

The address buffer 160 may include a multiplexer 154 that may be configured to receive a first portion (e.g., higher portion) of an N-bit address (e.g., row address) from the CA bus 130 and further configured to provide the first portion of the row address to one of a plurality of row address buffers 166. The address buffer 160 may include any number of row address buffers 166, such as four row address buffers 166 as illustrated in FIG. 1B.

The multiplexer 154 may be configured to provide the first portion of the row address to a row address buffer 166 based, at least in part, on a buffer address BA. By way of example, the buffer address BA may be used to determine which row address buffer 166 receives the first portion of the row address, in embodiments having 4 row address buffers 166, for instance, 2 bits of the buffer address BA may be used to determine the row address buffer 166 that receives the first portion of the row address.

Each of the row address buffers 166 may be coupled to a multiplexer 168. The multiplexer 168 may be configured to receive the first portion of the row address and provide it to a row address register 190 based, at least in part, on the buffer address BA. The row address register 190 may receive the first portion of the row address from the multiplexer 168 and further may receive a second portion (e.g., lower portion) of the row address from the CA bus 130. Accordingly, the row address register 190 may store an entire address. As previously described, the address may comprise N bits, and any number of bits may be allocated between the first and second portions of the row address. A row decoder 192 may be configured to receive the row address for accessing memory of array 194 associated with the address for read and/or write operations.

In an example read operation, read data may be provided from the array 194 to the multiplexer 172 via the I/O circuitry 196. The I/O circuitry 196 may include, for instance, a plurality of sense amplifiers configured to sense and/or amplify respective data such that the data may be provided to or received from the array 194. Based, at least in part, on the buffer address BA, the multiplexer 172 may provide the read data to one of a plurality of row data buffers 174 of the data buffer 170. The data buffer 170 may include any number of row data buffers 174 and in at least one embodiment, the address buffer 160 and data buffer 170 may include a same number of row address buffers 166 and row data buffers 174, respectively. In some embodiments, the number of row data buffers 174 and row address buffers 166 may be different. The read data may be provided from the row data buffer 174 to a multiplexer 176 based, at least on part, on the buffer address BA, and thereafter provided to a state machine 178. The state machine 178 may provide the read data to the data bus 135 based, at least in part, on a control signal CTL.

In an example write operation, write data (e.g., associated with a write command received on the CA bus) may be provided from the data bus 135 to the state machine 178. Based, at least in part, on the control signal CTL, the state machine 178 may provide the write data to the multiplexer 176, which may in turn provide the write data to one of the plurality of row data buffers 174 based, at least in part, on the buffer address BA. The selected row data buffer 174 may provide the write data to the multiplexer 172, which may in turn provide the write data to the I/O circuitry 196 for storing in the array 194. The write data may be stored in memory cells of the array 194 associated with the row address provided by the row decoder 192.

As previously described, the memory 150 may be configured to operate in accordance with three-phase addressing. Accordingly, during the first phase, a preactive command may cause a first portion of a row address to be provided to the multiplexer 154 over the CA bus 130. The first portion of the row address may be stored in a row address buffer 166.

In the second phase, an activate command may be provided and cause the first portion of the row address to be provided from the row address buffer 166 to the row address register 190. Moreover, a second portion of the row address may be provided to the row address register 190 over the CA bus 130. The row address may be used to access data of the array 194 such that data may be provided from the array 194 to a row data buffer 174. The particular row address buffer 166 and row data buffer 174 receive the first portion of the row address and the data from the array 194, respectively, may be based, at least in part, on a buffer address BA.

During the third phase, a read operation or a write operation may be performed in response to a read command or a write command, respectively. As previously described, commands provided in this manner may be provided after a tLAT period. In a read operation, the data stored in the row data buffer 174 may be provided to the data bus 135 as read data using the output state machine 178. In a write operation, write data may be received on the data bus 135 by the state machine 178 and provided to the row data buffer 174. The write data may then be stored in the array 194 at the row address.

FIG. 2A is a timing diagram 200 illustrating various signals of a read operation according to an embodiment of the present invention. The timing diagram 200 may include signals provided on the CA bus 130 and the data bus 135 of FIG. 1A.

At time T0, the controller 110 may provide a preactive command 202 on the CA bus 130, and at time T1, may further provide an activate read command 204. As previously described, the activate read command 204 may indicate an upcoming read operation. The activate read command 204 may be deasserted at time T2, and after a delay tRCD, at time T3, the controller 110 may provide a read command 206. The delay tRCD may, for instance, comprise a RAS to CAS delay that defines the minimum time between a time when an activate command is provided and a time when a subsequent read command or write command is provided. The time tRCD may be predetermined and/or specified in accordance with one or more standards, such as the JEDEC LPDDR2 standard.

At time T4, in response to the read command 206 and after a time RL has elapsed, the memory 120 may provide data not valid (DNV) information on the data bus 135. The time RL may comprise an amount of time for the memory 120 to provide a response (e.g., DNV or DV information) to the read command 206 and may comprise, for instance, a number of clock cycles (e.g., 3 clock cycles) of a system clock signal. In at least one embodiment, the DNV information 210 may be provided on data mask signal lines of the data bus 135 and further may be provided with a burst length having, for instance, a length of 8 bits. As previously described, the DNV information 210 may indicate that the memory 120 is not available to perform a read command. For example, the DNV information 210 may indicate that the tLAT period has not yet elapsed. The DNV information 210 may further include information indicating an amount of time until the apparatus 100 will be available to perform a read command, or the amount of time before the tLAT period elapses.

After time T5 at which the tLAT period elapses, the controller 110 may provide a read command 208 to the CA bus 130 at time T6. In response, at time T7, the memory 120 may provide DV information 212 on the data bus 135 indicating that the memory is available for the operation. As previously described, because the command is provided after the tLAT period has elapsed, the command may be performed. In at least one embodiment, the DV information 212 may be provided on the data mask signal lines of the data bus and the data associated with the read command 208 may be provided on the data bus at time T7 as well.

While the timing diagram 200 has been described with respect to read commands 206, 208, other read commands may be provided as well. For example, multiple read commands may be provided to cause the memory 120 to provide DNV information before the tLAT period has elapsed. Because each of these commands are provided before the apparatus 100 is available to perform a command, DNV information may be provided on the data bus 135 in response to each of these read commands, as previously described.

FIG. 2B is a timing diagram 250 illustrating various signals of a write operation according to an embodiment of the present invention. The timing diagram 250 may include signals provided on the CA bus 130 and the data bus 135 of FIG. 1A.

At time T0, a preactive command 252 may be provided on the CA bus 130. At time T1, the controller 110 may provide an activate write command 254, and at time T2 may no longer provide the write command 254. As previously described, the activate write command 254 may indicate an upcoming write operation. After a time tRCD, at time T3, a read command 256 may be provided.

At time T4, after RL has elapsed, the memory 120 may provide DNV information 270 on the data bus 135 in response to the read command 256. The read command 256, for example, may be used to cause the memory 120 to provide DNV or DV information. The DNV information 270 may be provided on data mask signal lines of the data bus 135 and may be provided with a burst length, for instance, of 8 bits. As previously described, the DNV information 270 may indicate that the memory 120 is not yet available to perform a write command. The DNV information 270 may further include information indicating an amount of time until the memory 120 will be available to perform a command.

After time T5 at which the tLAT period elapses, the controller 110 may provide a read command 258 on the CA bus 130 at time T6. In response, at time T7, the memory 120 may provide DV information 272 on the data bus, e.g., data mask signal lines, indicating that the memory is available for the operation. Because the command is provided at a time after the tLAT period has elapsed, a write command may be performed. In response to the DV information 272 being provided on the data bus 135, the controller may provide a write command 260 on the CA bus 130 at a time T8. Write data 274 associated with the write command 260 is provided to the memory 120 on the data bus 135 at time T9.

While the timing diagram 200 of FIG. 2A and the timing diagram 250 of FIG. 2B have been described with respect to read commands 206, 208, and 256, 258, respectively, other read commands may be provided as well. For example, in some embodiments, an external device may be configured to periodically provide read commands to cause the memory 120 to provide DNV/DV information until DV information is provided, e.g., multiple read commands may be provided before the tLAT period has elapsed. In other embodiments, the external device may be configured to provide one or more read commands based, at least in part, on information included in the DNV information. By way of example, DNV information may indicate that the tLAT period may elapse in 50 microseconds, and the controller 110 may wait 50 or more microseconds before providing another read command.

Moreover, in both the timing diagram 200 of FIG. 2A and the timing diagram 250 of FIG. 2B, a respective read command is provided a time tRCD after an activate command is provided. In this manner, it may be determined whether the memory 120 is available to perform a read command or a write command. As previously described, read commands may be provided periodically and/or based, at least in part, on information included with DNV information. Accordingly, in at least one embodiment, for read operations, read commands may be provided until DV information and associated read data is provided to the data bus 135. For write operations, read commands may be provided until DV information is provided, and in response, a write command may be provided causing the memory 120 to store write data provided from the data bus 135.

Figure 3A:
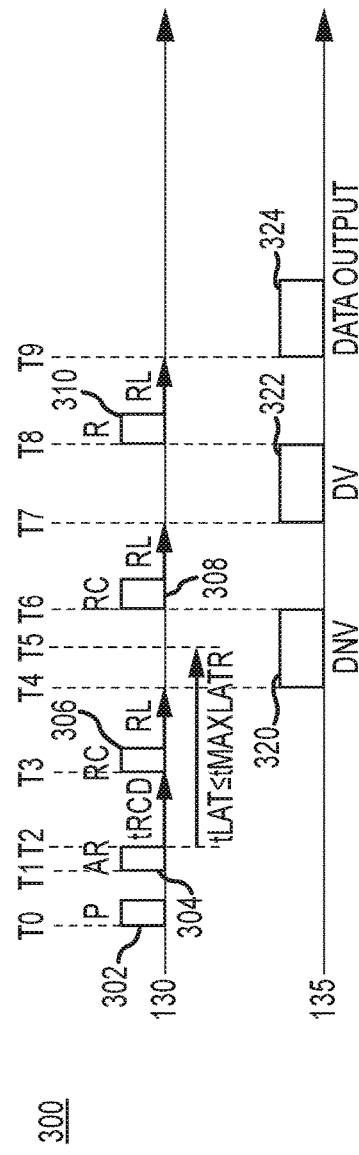
FIG. 3A is a timing diagram illustrating various signals of a read operation according to an embodiment of the present invention.

FIG. 3A is a timing diagram 300 illustrating various signals of a read operation according to an embodiment of the present invention. The timing diagram 300 may include signals provided on the CA bus 130 and the data bus 135 of FIG. 1A.

At time T0, the controller 110 may provide a preactive command 302 on the CA bus 130, and at time T1, may further provide an activate read command 304. The activate read command 304 may be deasserted at time T2, and after a time tRCD, at time T3, the controller 110 may provide a read check command 306. The read check command 306 may comprise a "dummy" command that may cause the memory 120 to indicate whether it is available to perform a command (e.g., provide DNV information or DV information), that is, whether the tLAT period has elapsed. In at least one embodiment, providing the read check command 306 may comprise providing a read command and asserting one or more particular bits of the buffer address BA (e.g., bit 2 of the buffer address BA). In other embodiments, particular signal combinations on the CA bus 130 may be used to provide a read check command.

In response to the read check command 306, the memory 120 may provide DNV information 320 on the data bus 135 at time T4. The DNV information 320 may indicate that the tLAT period has not yet elapsed, and may further may include information indicating an amount of time until the tLAT period will elapse.

After time T5 at which the tLAT period elapses, the controller 110 may provide a read check command 308 on the CA bus 130 at time T6. In response, at time T7, the memory 120 may provide DV information 322 on the data bus 135 indicating that the memory 120 is available for a read operation. Accordingly, the controller 110 may provide a read command 310 at a time T8, and at time T9, the memory 120 may provide read data 324 associated with the read command 310 to the data bus 135.

Figure 3B:
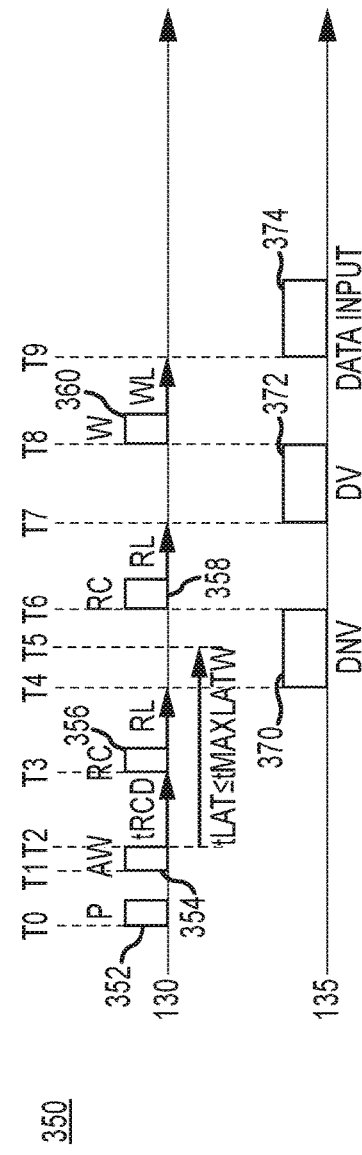
FIG. 3B is a timing diagram illustrating various signals of a write operation according to an embodiment of the present invention.

FIG. 3B is a timing diagram 350 illustrating various signals of a write operation according to an embodiment of the present invention. The timing diagram 350 may include signals provided on the CA bus 130 and the data bus 135 of FIG. 1A.

At time T0, the controller 110 may provide a preactive command 352 on the CA bus 130, and at time T1, and further may provide an activate write command 354. The activate write command 354 may be deasserted at time T2, and after a time tRCD, at time T3, the controller 110 may provide a read check command 356. As previously described, the read check command 356 may comprise a "dummy" command that may cause the memory 120 to indicate whether it is available to perform a command (e.g., provide DNV information or DV information). Because the activate command 354 is an activate write command, the read check command 356 may cause the memory 120 to indicate whether it is available to perform a write command. The read check command may be provided by asserting a read command and one or more particular bits of the buffer address BA (e.g., bit 2 of the buffer address BA), or by asserting particular signal combinations on the CA bus 130.

In response to the read check command 356, the memory 120 may provide DNV information 370 on the data bus 135 at time T4, indicating to the controller 110 that the tLAT period has not elapsed since an activate command was provided. The DNV information 370 may further may include information indicating an amount of time until the tLAT period will elapse.

After time T5 at which the tLAT period elapses, the controller 110 may provide a read check command 358 on the CA bus 130 at time T6. In response, at time T7, the memory 120 may provide DV information 372 on the data bus 135 indicating that the memory is available for a write operation. The controller 110 may provide a write command 360 at time T8, and at time T9, the controller 110 may further provide write data 374 to the data bus 135 for storing in the memory 120.

Timing diagram 300 of FIG. 3A and timing diagram 350 of FIG. 3B have been described with reference to a read check command. In at least one embodiment, the read check command may differ from a read command in that the apparatus 100 may provide indication of its status without providing any data to the data bus 135.

FIG. 4A is a timing diagram 400 illustrating various signals of a read operation according to an embodiment of the present invention. The timing diagram 400 may include signals provided on the CA bus 130 and the data bus 135 of FIG. 1A.

At time T0, the controller 110 may provide a preactive command 402 on the CA bus 130, and at time T1, may further provide an activate read command 404. In response to the activate read command 404, the memory 120 may provide DNV information 420 to the data bus 135, and in at least one embodiment, the DNV information 420 may be provided on the data bus 135 until time T4 at which the tLAT period elapses. Moreover, the memory 120 may provide DV information 422 on the data bus 135 at time T4. In response to the DV information 422 being provided, the controller 110 may provide a read command 406 at time T5, thereby causing the memory 120 to provide read data 424 on the data bus 135 at time T6.

FIG. 4B is a timing diagram 450 illustrating various signals of a write operation according to an embodiment of the present invention. The timing diagram 450 may include signals provided on the CA bus 130 and the data bus 135 of FIG. 1A.

At time T0, the controller 110 may provide a preactive command 452 on the CA bus 130, and at time T1, may further provide an activate write command 454. In response to the activate write command 454, the memory 120 may provide DNV information 470 on the data bus 135, and in at least one embodiment, the DNV information 470 may be provided until time T3 at which the tLAT period elapses. Moreover, the memory 120 may provide DV information 472 at time T3. In response to the DV information 472 being provided, the controller 110 may provide a write command 456 at time T4. The controller 110 may further provide write data 474 to the data bus 135 at time T5 for storing in the memory 120.

Figure 5:
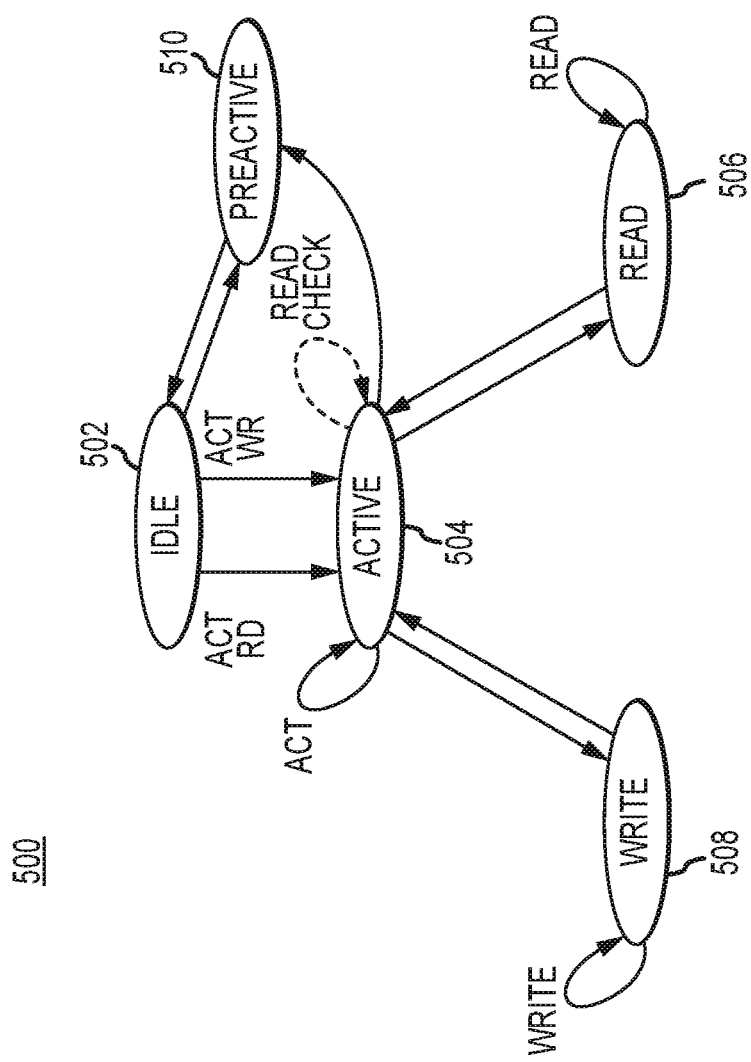
FIG. 5 is a schematic state diagram illustrating various states of operation of an apparatus according to an embodiment of the present invention.

FIG. 5 is a schematic state diagram 500 illustrating various states of operation of an apparatus according to an embodiment of the present invention. The state diagram 500 may include an idle state 502, an active state 504, a read state 506, and a write state 508, and a preactive state 510 and may be used, for instance, in operation of an apparatus, such as the apparatus 100 of FIG. 1A. The state diagram 500 may be used to implement, modify, or replace, wholly or in part, any state diagram in accordance with one or more standards, such as the JEDEC LPDDR2 standard. In at least one embodiment, the state diagram 500 may comprise a simplified version of a state diagram and accordingly may omit one or more known states to avoid unnecessarily obscuring the invention.

In an example operation, after initialization, the apparatus 100 may enter the idle state 502. In the idle state 502, the apparatus 100 may not be operating in any of the phases of three-phase addressing described herein. In response to a preactive command, the apparatus 100 may enter the preactive state 510 and operate in a first phase of three-phase addressing. Once the first phase has completed, the apparatus 100 may reenter the idle state 502.

In response to an activate command (e.g., activate read or activate write), the apparatus 100 may enter the active state 504. When in the active state 504, the apparatus 100 may operate in a second phase of three-phase addressing. As previously described, the controller 110 may provide an activate read command or an activate write command, and the memory 120 may manage any operations during a tLAT period. As previously described, in at least one embodiment, the memory 120 may be configured to complete the second phase of three-phase addressing within tMAXLATR in response to an activate read command and within tMAXLATW in response to an activate write command.

In accordance with at least one embodiment of the invention, once in an active state 504 the controller 110 may provide a command to the memory 120, for example, as previously described with reference to FIGS. 2A and 2B. As previously described, in some instances, the controller 110 may provide a read command, for instance, before the tLAT period elapses. Accordingly, the apparatus 100 may enter the read state 506, provide DNV information, and return to the active state 504. If a read command is received at a time at which the apparatus 100 is available to perform a read command, for instance the tLAT period has elapsed, the apparatus 100 may enter the read state 506, provide DV information, and return to the active state 504. If the activate command was an activate read command, the memory 100 may further provide read data with the DV information. If the activate command was an activate write command, the apparatus 100 may return to the active state 504. Subsequently, the apparatus 100 may enter the write state 508, and the controller 110 may provide a write command and associated write data to the memory 120. The memory 120 may store write data associated with the write command and the apparatus 100 may return to the active state 504.

In other embodiments, once in an active state, the controller 110 may provide a read check command to the memory 120, for example, as previously described with reference to FIGS. 3A and 3B. In response, the memory 120 may provide DNV information if the read check command is received before the tLAT period elapses. If the read check command is received after the tLAT period has elapsed, the memory 120 may provide DV information if the read check command and the apparatus 100 may return to the active state 504 once the DV information is provided. A read or write command may subsequently be performed by entering the read state 506 or the write state 508, respectively. Once the command has been performed, the apparatus 100 may return to the active state 504.

In yet other embodiments, once in the active state 504, the memory 120 may provide DNV information to the controller 110 until the memory 120 is available to perform a command, for instance, after the tLAT period has elapsed, for example, as previously described with reference to FIGS. 4A and 4B. Once the memory 120 is available to perform a command, the memory 120 may provide DV information. A read or write command may subsequently be performed by entering the read state 506 or the write state 508, respectively. Once the command has been performed, the apparatus 100 may return to the active state 504.

In each case, after performing a read command or a write command, the apparatus 100 may return to the active state 504. During a subsequent three-phase addressing process, another preactive command may be provided. The apparatus 100 may enter the preactive state 510 and transition to the idle state 502 before receiving an active command, as previously described.

FIG. 6 is a table 600 illustrating example latencies according to an embodiment of the present invention. As previously described, tMAXLATR and tMAXLATW may comprise maximum times for the tLAT period for read and write operations, respectively. The table 600 illustrates example latencies for both tMAXLATR and tMAXLATW that may be used in accordance with described examples. Values for tMAXLATR and tMAXLATW may be stored in one or more registers, such as a transparent operations register (TOR). Registers storing tMAXLATR and tMAXLATW may, in some embodiments, may be read-only, or may be writeable such that a user may specify values for tMAXLATR and/or tMAXLATW.

FIG. 7 is a table 700 illustrating example bit assignments for wait states during memory operations according to an embodiment of the present invention. As previously described, DNV information, such as the DNV information 210 of FIG. 2, may include information indicating the remaining duration before the tLAT period elapses. As illustrated in FIG. 7, in at least one embodiment, DNV information may indicate whether relatively short, normal, or long periods of time remain. In this manner, a controller, such as the controller 110 of FIG. 1A, may determine whether to hold the CA bus 130 and/or the data bus 135 in a wait state, or to abort (e.g., terminate) a pending command such that another command, for instance, having higher priority, may be performed. In at least one embodiment, information included in the DNV information may be provided in parallel and/or in serial using one or more data mask signal lines of the data bus 135.

FIG. 8 is a table 800 illustrating example bit assignments for acknowledgement events of memory commands according to an embodiment of the present invention. As previously described, DV information may be used to indicate that the apparatus 100 is available to perform a read command or a write command, respectively. In some embodiments, and as illustrated in FIG. 8, the DV information may further include information, for instance, indicating whether an error has occurred and/or whether a particular action (e.g., check status register) is suggested as a result. In at least one embodiment, each of the bit state assignments may be provided in parallel and/or in serial using one or more data mask signal lines of the data bus 135.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a memory configured to receive an activate command indicative of a type of a command during a first addressing phase and to receive the command during a second addressing phase, the memory further configured to provide information indicating that the memory is not available to perform the command responsive, at least in part, to receiving the command during a variable latency period and to provide information indicating that the memory is available to perform the command responsive, at least in part, to receiving the command after the variable latency period, wherein the information is indicative of a remaining length of the variable latency period and the remaining length is one of a relatively short, normal, or long period of time.

2. The apparatus of claim 1, wherein the variable latency period is measured relative to the activate command.

3. The apparatus of claim 1, wherein the command comprises at least one of a read command or a read check command.

4. The apparatus of claim 1, wherein a maximum duration of the variable latency period is based, at least in part, on a type of the activate command.

5. The apparatus of claim 1, wherein the information indicating that the memory is not available to perform a command comprises data not valid information.

6. The apparatus of claim 5, wherein the data not valid information is indicative of a remaining duration of the variable latency period.

7. The apparatus of claim 1, wherein the activate command comprises an activate read command or an activate write command.

8. The apparatus of claim 1, further comprising:
    a controller coupled to the memory and configured to provide the activate command.

9. The apparatus of claim 1, wherein the memory is configured to transmit or receive data associated with the command in response to the memory receiving the command after the variable latency period.

10. An apparatus, comprising:
    a memory configured to provide first information during a variable latency period indicating the memory is not available to perform a command, wherein the first information is indicative of a remaining length of the variable latency period, the remaining length is one of a relatively short, normal, or long period of time, the memory configured to provide second information in response to receiving the command after the latency period.

11. The apparatus of claim 10, wherein the memory is further configured to manage memory operations during the variable latency period.

12. The apparatus of claim 10, wherein the command comprises at least one of an activate read command or an activate write command.

13. The apparatus of claim 12, wherein the activate read command and the activate write command are based, at least in part, on one or more bits of a buffer address.

14. The apparatus of claim 10, wherein the memory is further configured to provide the second information responsive, at least in part, to the variable latency period elapsing.

15. The apparatus of claim 10, wherein the variable latency period has a first maximum duration when the command comprises an activate read command and a second maximum duration when the command comprises an activate write command.

16. The apparatus of claim 10, wherein the second information is indicative of at least one of an error or a suggested action.

17. A method, comprising:
- receiving a command, the command comprising at least one of an activate read command or an activate write command;
- transmitting, by a memory, first information during a variable latency period indicating the memory is unavailable to perform the command, the first information indicative of a remaining length of the variable latency period, the remaining length is one of a relatively short, normal, or long period of time; and
- transmitting, by the memory, second information in response to receiving the command after the latency period, the second information comprising at least one of an error or a suggested action.

18. The method of claim 17, wherein transmitting the first information includes transmitting data not valid information.

19. The method of claim 17, wherein transmitting the second information includes transmitting data valid information.

20. The method of claim 17, wherein transmitting the second information includes transmitting the second information in response to the variable latency period elapsing.

* * * * *